(12) United States Patent
Dorval Courchesne et al.

(10) Patent No.: US 9,805,841 B2
(45) Date of Patent: Oct. 31, 2017

(54) VIRUS FILM AS TEMPLATE FOR POROUS INORGANIC SCAFFOLDS

(71) Applicant: Massachusetts Institute of Technology, Cambridge, MA (US)

(72) Inventors: Noemie-Manuelle Dorval Courchesne, Cambridge, MA (US); Angela M. Belcher, Lexington, MA (US); Paula T. Hammond, Newton, MA (US); Matthew T. Klug, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 59 days.

(21) Appl. No.: 13/934,964

(22) Filed: Jul. 3, 2013

(65) Prior Publication Data

US 2014/0048126 A1    Feb. 20, 2014

Related U.S. Application Data

(60) Provisional application No. 61/667,939, filed on Jul. 3, 2012, provisional application No. 61/669,607, filed on Jul. 9, 2012.

(51) Int. Cl.
*H01L 31/00* (2006.01)
*H01B 5/00* (2006.01)
(Continued)

(52) U.S. Cl.
CPC ............... *H01B 5/00* (2013.01); *B82Y 30/00* (2013.01); *C01B 13/32* (2013.01); *C01G 23/053* (2013.01); *C01G 23/0536* (2013.01); *H01B 1/02* (2013.01); *H01B 1/08* (2013.01); *H01L 31/032* (2013.01); *B22F 1/0018* (2013.01); *B22F 1/0025* (2013.01); *C01P 2002/72* (2013.01); *C01P 2002/85* (2013.01); *C01P 2004/03* (2013.01); *C01P 2004/64* (2013.01); *C22C 5/02* (2013.01);
(Continued)

(58) Field of Classification Search
None
See application file for complete search history.

(56) References Cited

U.S. PATENT DOCUMENTS

2004/0238826 A1 * 12/2004 Sekiguchi ............ H01G 9/2009
257/79
2005/0034755 A1 * 2/2005 Okada .................. B32B 17/06
136/256

(Continued)

FOREIGN PATENT DOCUMENTS

WO   WO 2007/120762      10/2007
WO   WO 2010/071831 A2   6/2010
WO   WO 2011/042564 A1   4/2011

OTHER PUBLICATIONS

Fujikawa et al., Langmuir, 2003, No. 19, 6545-6552.*
(Continued)

*Primary Examiner* — Eli Mekhlin
(74) *Attorney, Agent, or Firm* — Foley & Lardner LLP

(57) ABSTRACT

Virus multilayers can be used as templates for growth of inorganic nanomaterials. For example, layer-by-layer construction of virus multilayers on functionalized surfaces form nanoporous structures onto which metal particles or metal oxide nanoparticles can be nucleated to result in an interconnected network of nanowires.

13 Claims, 15 Drawing Sheets

(51) Int. Cl.
*B82Y 30/00* (2011.01)
*C01G 23/053* (2006.01)
*H01B 1/02* (2006.01)
*H01B 1/08* (2006.01)
*H01L 31/032* (2006.01)
*C01B 13/32* (2006.01)
*C22C 5/02* (2006.01)
*B22F 1/00* (2006.01)

(52) U.S. Cl.
CPC ............... Y10T 428/24355 (2015.01); Y10T 428/24997 (2015.04)

(56) References Cited

U.S. PATENT DOCUMENTS

| | | | |
|---|---|---|---|
| 2006/0121346 A1* | 6/2006 | Nam | H01B 1/122 429/212 |
| 2007/0178241 A1* | 8/2007 | Martinotto | H01G 9/2031 427/419.2 |
| 2010/0012166 A1* | 1/2010 | Yamanaka | H01G 9/2031 136/244 |
| 2010/0291541 A1 | 11/2010 | Evoy et al. | |
| 2011/0036404 A1* | 2/2011 | Tomita | H01G 9/2031 136/258 |

OTHER PUBLICATIONS

Tetreault et al., "High-Efficiency Solid-State Dye-Sensitized Solar Cells: Fast Charge Extraction through Self-Assembled 3D Fibrous Network of Crystalline TiO2 Nanowires," ACS Nano, 2010, 4 (12), pp. 7644-7650.*

Dang et al., "Virus-templated self-assembled single-walled carbon nanotubes for highly efficient electron collection in photovoltaic devices," Nature Nanotechnology, Apr. 24, 2011, 6(6):377-384.

Lee et al., "Highly Interconnected Porous Electrodes for Dye-Sensitized Solar Cells Using Viruses as a Sacrificial Template," Adv. Funct. Mater., 2011, 21:1160-1167.

Qi et al., "Highly Efficient Plasmon-Enhanced Dye-Sensitized Solar Cells through Metal@Oxide Core-Shell Nanostructure," ACS Nano, Aug. 4, 2011, 5(9):7108-7116.

Yoo et al., "Spontaneous assembly of viruses on multilayered polymer surfaces," Nature Materials, Mar. 1, 2006, 5(3):234-240.

* cited by examiner

US 9,805,841 B2

VIRUS FILM AS TEMPLATE FOR POROUS INORGANIC SCAFFOLDS

CLAIM OF PRIORITY

This application claims the benefit of prior U.S. Provisional Application No. 61/667,939, filed on Jul. 3, 2012, and U.S. Provisional Application No. 61/669,607, filed Jul. 9, 2012, each of which is incorporated by reference in its entirety.

TECHNICAL FIELD

This invention relates to an inorganic particle scaffold.

BACKGROUND

Nanomaterials are more and more important for many applications. But nanomaterials face some challenge in some areas. It has been very difficult to create nanowire networks and interconnected bicontinuous morphologies that have length scales in the 5 to 50 nm range, which is particularly important for bulk heterojunction devices, light emitting devices, electrochemical storage systems, and other devices in which the harvesting or manipulation of excitons and the isolated transport of electrons and holes is desired. Furthermore, in catalytic or electrochemical systems in which surface area is of particular interest, finer dimensions lead to significant increases in surface area per unit volume, making truly nanoporous (as opposed to micro—or mesoporous) networks of great interest.

SUMMARY

Virus multilayers can be used as templates for growth of inorganic nanomaterials. For example, layer-by-layer construction of virus multilayers on functionalized surfaces form nanoporous structures onto which metal particles or metal oxide nanoparticles can be nucleated to result in an interconnected network of nanowires.

In one aspect, a method for preparing a multi-layer structure on a substrate can include contacting a surface of a functionalized substrate with a crosslinking solution, exposing the surface to a virus to form a porous virus template, and growing a metal or metal oxide material from a precursor on the porous virus template. The method can include cleaning a surface of the substrate prior to the contacting step. In certain circumstances, the method can include plasma treating a surface of the substrate prior to the contacting step.

In another aspect, a multi-layer structure can include a metal or metal oxide film having pore sizes between 2 and 40 nm formed on a porous virus template.

In another aspect, a photovoltaic device can include a first electrode, a second electrode, and a metal or metal oxide film between the first and second electrodes, the metal or metal oxide film comprising pores with sizes between 2 and 40 nm formed on a porous virus template.

In certain circumstances, the substrate can be silicon, glass, or a transparent conducting oxide, for example, FTO or ITO.

In certain circumstances, the functionalized substrate can include an aminopropylsilane functional group, a carboxyethylsilane functional group, or an amine functional group and a carboxylic acid functional group, or combinations thereof. In certain circumstances, the functionalized substrate can be positively charged.

In certain circumstances, the crosslinking solution can include a carbodiimide.

In certain circumstances, the virus can include an M13 bacteriophage. The density of the bacteriophage template can be in the range of $10^{-8}$ to $10^{-6}$ µg/µm³.

In certain circumstances, the precursor can include a titanium compound.

In certain circumstances, the metal oxide can include a manganese oxide, a magnesium oxide, an aluminum oxide, a silicon oxide, a zinc oxide, a copper oxide, a nickel oxide, a cobalt oxide, an iron oxide, a titanium oxide, yttrium oxide, a zirconium oxide, a niobium oxide, a ruthenium oxide, a rhodium oxide, a palladium oxide, a silver oxide, an indium oxide, a tin oxide, an lanthanum oxide, an iridium oxide, a platinum oxide, a gold oxide, a cerium oxide, a neodymium oxide, a praseodymium oxide, an erbium oxide, a dysprosium oxide, a terbium oxide, a samarium oxide, a lutetium oxide, a gadolinium oxide, a ytterbium oxide, a europium oxide, a holmium oxide, a scandium oxide, or a combination thereof.

In certain circumstances, the roughness of the structure can be about 40% of the thickness.

In certain circumstances, nanoparticles can be spatially organized into two distinct layers. For example, the nanoparticle can include a first metal oxide or metal nanoparticle and a second metal oxide or metal nanoparticle. The first metal oxide or metal nanoparticle and the second metal oxide or metal nanoparticle can be in at least two different layers. In certain embodiments the first nanoparticle and the second nanoparticle can be the same composition. In other embodiments the first nanoparticle and the second nanoparticle can be different materials.

Other aspects, embodiments, and features will be apparent from the following description, the drawings, and the claims.

BRIEF DESCRIPTION OF THE DRAWINGS

FIGS. 8A and 8B are top surface SEM images of the phage film coated with titania and annealed at 450° C. FIG. 8A is a micrograph depicting a surface where the reaction was stopped early (after 40 minutes). FIG. 8B is a micrograph depicting a surface where the coating was allowed to proceed fully for an optimal reaction time of an hour. The color of the titania solution at these time point is show in the insets. Images of films coated with $TiO_2$ for an hour are shown at two different magnifications. FIG. 8C is a graph depicting pore size distribution based on 5 different top surface SEM images, analyzed with ImageJ. FIGS. 8D and 8E. are TEM images of the cross-section of a titania coated film constructed on silicon and prepared with a focused ion beam, for an hour reaction in $TiCl_4$ (FIG. 8D—dark field TEM image, FIG. 8E—TEM image). FIG. 8F is a STEM image contrasting the titania nanowires (brighter), from the silicon nitride support film that the phage film was constructed on (pale grey), and empty spaces (black).

FIG. 9A is a graph depicting XPS depth profiling analysis of the gold distribution as a function of the film depth, converted to nanoparticle to phage ratio for three different film architectures. Nanoparticles were infiltrated post-assembly, either by dropcasting the solution of nanoparticles onto the film, or by immersing the film in a solution of nanoparticles 55. FIG. 9B is an SEM image of a phage film infiltrated with Au nanoparticles, and coated with titania. The clearer circles are the Au nanoparticles dispersed within the nanowire network. FIG. 9C is a graph depicting LbL incorporated layers of phages attached to Au nanoparticles and the corresponding XPS depth profiling analysis. FIG. 9D is a graph depicting comparison of optical properties of Au nanoparticles under different conditions; in solution, complexed to bacteriophages in solution and incorporated into bacteriophage films during (LbL) or post-assembly (Dropcast).

FIG. 11A is an atomic force microscopy image (amplitude) of a silicon substrate functionalized with APTES and functionalized with one layer of bacteriophages. FIG. 11B is a schematic representation of the covalent LbL process.

FIG. 14A is a graph depicting overview of the atomic concentrations of Ti, O, C and Si, by monitoring Ti2p, O1s, C1s and Si2p respectively. FIG. 14B is graph depicting a closer look at the carbon concentration inside of the film.

DETAILED DESCRIPTION

Figure 1:
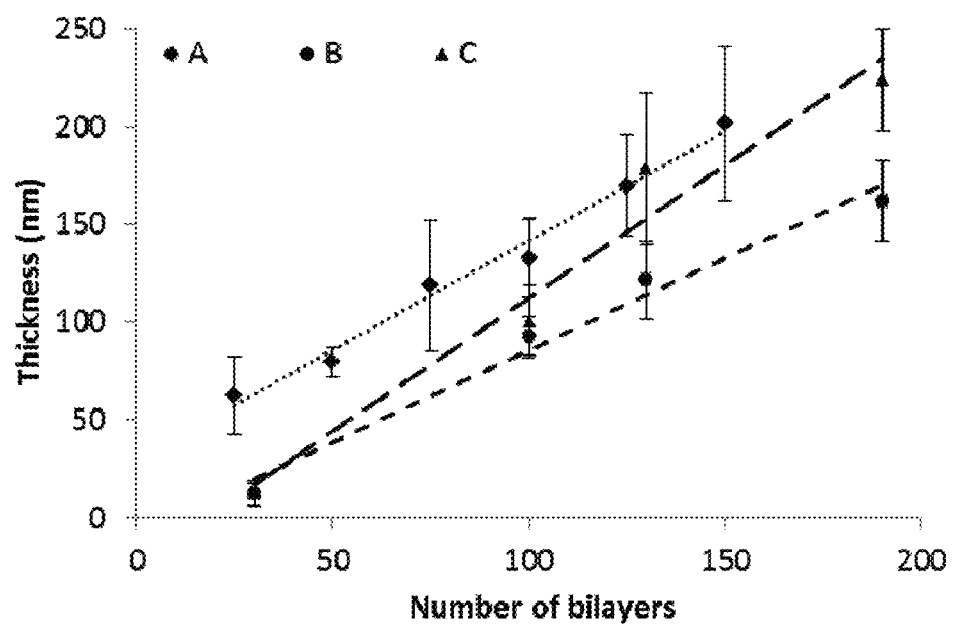
FIG. 1 is a graph depicting a growth curve of the bacteriophage assembly for three different experiment conditions

High aspect ratio bacteriophages constitute unique templates for the creation of nanowires of different inorganic materials because they can specifically bind and align nanomaterials and their precursors. Organizing these phages into a three dimensional network creates a porous scaffold onto which metallic nanoparticles, crystals or metal oxides like titania can be assembled. These networks provide a means of manipulating electron and other carrier transport within electrochemical or photoactive devices. Thin bacteriophage films of hundreds of nanometers in thickness can be constructed by a covalent layer-by-layer assembly method that can use a carbodiimide crosslinker commonly employed in bioconjugation. This method enables the tight control of the thickness and composition of different substrate-specific bacteriophage layers. The films allow for the templating of inorganic nanowire networks, and also for the incorporation of other polymeric or metallic materials into the pores, and could be applied to energy related devices.

Nanoporous metals and transition metal oxides, such as crystalline porous $TiO_2$ having a high surface area, can be very attractive materials due to high surface areas, porosity, and activity in catalytic reactions. In addition, nanoporosity can be considered to be important in energy storage aspects, as the porosity plays an important role in the electrochemical reactions.

Porous inorganic three dimensional scaffolds can be desirable for several applications such as catalysis, batteries and photovoltaics. When porous structures are used in catalysis, the increased surface area can improve the efficiency of the catalytic process. As a result, the enhancement in nanoporous or mesoporous textural structure of the film can be beneficial to the acceleration of mass transfer of the chemicals to the catalyst active sites and beneficial to the formation of large number of active sites.

For several electrochemical and photovoltaic applications, nanoporous structures confer advantages over bulk, macro- or micro-porous materials. As the pore size decreases, the available surface area increases for a constant volume of material. This active surface can be catalytic or photoactive. It can also be modified to display functional groups, or be loaded with active materials. Porous nanostructures have attracted interested and have been employed to improve the device performance for battery applications, catalysis, biosensing, and photovoltaics. See, for example, Wang, J., et al., Synthesis of nanoporous three-dimensional current collector for high-performance lithium-ion batteries. RSC Advances, 2013. 3(20): p. 7543-7548, Scavetta, E., et al., Nanoporous Ge coated by Au nanoparticles for electrochemical application. Electrochemistry Communications, 2013. 30(0): p. 83-86, Wittstock, A., et al., Nanoporous gold: a new gold catalyst with tunable properties. Faraday Discussions, 2011. 152(0): p. 87-98, Cui, H.-F., et al., Immobilization of glucose oxidase into a nanoporous $TiO_2$ film layered on metallophthalocyanine modified vertically-aligned carbon nanotubes for efficient direct electron transfer. Biosensors and Bioelectronics, 2013. 46(0): p. 113-118, Baek, W.-H., et al., Hybrid inverted bulk heterojunction solar cells with nanoimprinted $TiO_2$ nanopores. Solar Energy Materials and Solar Cells, 2009. 93(9): p. 1587-1591, and Oosterhout, S. D., Wienk, Martijn M., van Bavel, Svetlana S., Thiedmann, Ralf, Jan Anton Koster, L., Gilot, Jan, Loos, Joachim, Schmidt, Volker, Janssen, Rene A. J., The effect of three-dimensional morphology on the efficiency of hybrid polymer solar cells. Nat Mater, 2009. 8(10), each of which is incorporated by reference in its entirety. Nanoporosity also reduces the dimensions of the void domains, and thus, if filled with a second material, the distance between the two material phases.

In bulk heterojunction solar cells, especially the ones relying on conjugated polymers for light absorption, a nanoporous bi-continuous morphology is essential to achieve a high performance. See, Nicholson, P. G. and F. A. Castro, Organic photovoltaics: Principles and techniques for nanometre scale characterization. Nanotechnology, 2010. 21(49), and Wang, H., et al., Titania bicontinuous network structures for solar cell applications. Applied Physics Letters, 2005. 87(2), each of which is incorporated by reference in its entirety. Because of lifetime of photogenerated excitons in conjugated polymers, the dimensions of the polymer domains must in the order of ten to twenty nanometers in order to prevent exciton recombination and allow for more charges to be collected. See, Coakley, K. M. and M. D. McGehee, Conjugated polymer photovoltaic cells. Chemistry of Materials, 2004. 16(23): p. 4533-4542, which is incorporated by reference in its entirety. The electron donor and electron acceptor materials forming the heterojunction must also be in close contact and share a large surface area to improve charge dissociation. Finally, the pathways for charge transport must be as continuous, elongated, and direct as possible to the electrodes. See, Li, S. S., et al., Interplay of three-dimensional morphologies and photocarrier dynamics of polymer/$TiO_2$ bulk heterojunction solar cells. Journal of the American Chemical Society, 2011. 133(30): p. 11614-11620, and Weickert, J., et al., Nanostructured Organic and Hybrid Solar Cells. Advanced Materials, 2011. 23(16): p. 1810-1828, each of which is incorporated by reference in its entirety. Therefore, a nanoporous network of nanowires could serve as a useful template for the assembly of photoactive materials. Furthermore, the controlled incorporation of metallic nanoparticles, such as gold or silver, is desirable to generate plasmon resonances in photovoltaic devices. Tandem solar cells also require the stacking of different layer of materials for selective light absorption, which calls for a high degree of control on the spatial organization of nanomaterials inside of the thin film. See, Yang, J., et al., Plasmonic Polymer Tandem Solar Cell. ACS Nano, 2011. 5(8): p. 6210-6217, Gan, Q., F. J. Bartoli, and Z. H. Kafafi, Plasmonic-Enhanced Organic Photovoltaics: Breaking the 10% Efficiency Barrier. Advanced Materials, 2013. 25(17): p. 2385-2396, and Choi, J. J., et al., Solution-Processed Nanocrystal Quantum Dot Tandem Solar Cells. Advanced Materials, 2011. 23(28): p. 3144-3148, each of which is incorporated by reference in its entirety.

Among the nanoporous transition metal oxides, crystalline porous $TiO_2$ with a high surface area is a very attractive material due to its well-known activity in catalytic reactions. In addition, nanoporosity is considered to be equally important in energy storage aspects, as the porosity plays an important role in the electrochemical reactions.

One method of preparing porous metal or metal oxide films is by sol-gel process. For example, $TiO_2$ thin films with hierarchical pore structure (macropores and nested mesopores) can be obtained in one step by a combination of sol-gel synthesis with controlled phase separation. Polyethylene glycol (PEG) is a traditional pore-forming reagent commonly used for the synthesis of porous $TiO_2$ thin films. PEG 2,000 induces a phase separation upon film formation, producing macropores with controllable diameters. Cationic surfactant of cetyltrimethylammonium bromide (CTAB) can be used as a structure-oriented agent. $TiO_2$ photocatalyst can be prepared using sol-gel method with a mixed template of PEG and CTAB at low temperature.

In addition to porous $TiO_2$ structure, various ZnO superstructures (sheet, platelet, ring) have been achieved with the assistance of surfactant CTAB, which plays a critical role to effectively control the morphology of building blocks. Lamellar mesostructures $WS_2$ (tungsten disulfide) nanotubes were also developed by cationic surfactant molecules in solution under appropriate conditions.

Another method of preparing porous metal or metal oxide films is by using a virus template. Typically, nanopore arrays are created with energy intensive specialized processes such as the etching of surfaces or membranes with an electron beam, employing lithography, or atomic layer deposition. See, Knez, M., K. Nielsch, and L. Niinisto, Synthesis and Surface Engineering of Complex Nanostructures by Atomic Layer Deposition. Advanced Materials, 2007. 19(21): p. 3425-3438, which is incorporated by reference in its entirety. The simple template approach is also used to generate porous structures. However, most of the templates employed generate mesopores or micropores, as opposed to nanopores. See, for example, Wang, Y., et al., Nanoporous Metal Membranes with Bicontinuous Morphology from Recyclable Block-Copolymer Templates. Advanced Materials, 2010. 22(18): p. 2068-2072, Zakaria, M. B., et al., Preparation of Mesoporous Titania Thin Films with Well-Crystallized Frameworks by Using Thermally Stable Triblock Copolymers. European Journal of Inorganic Chemistry, 2013. 2013(13): p. 2330-2335, and Chen, P.-Y., et al., Layer-by-layer assembled porous photoanodes for efficient electron collection in dye-sensitized solar cells. Journal of Materials Chemistry A, 2013. 1(6): p. 2217-2224, each of which is incorporated by reference in its entirety. Remarkably, it is possible to construct nanoporous networks via layer-by-layer assembly of the high aspect ratio M13 bacteriophage, and that these networks can be assembled with a nanoscale control on their composition. Biological systems possess inherent molecular recognition and self-assembly capabilities. Highly organized from molecular-scale building blocks such as nucleic acids and proteins with intricate hierarchical architectures, biological systems are attractive templates for constructing complex material structures with molecular precision and represent unparalleled examples of bottom-up assembly.

In biological systems, organic molecules exert a remarkable level of control over inorganic material nucleation, phase stabilization, assembly, and pattern formation at a molecular scale. This ability to direct the assembly of nanoscale components into controlled and sophisticated structures has motivated intense efforts to develop assembly methods that mimic or exploit the recognition capabilities and interactions found in biological systems.

Integration of these unique capabilities of biomolecules with the design of new materials can offer many opportunities for nanofabrication including rational molecular design through genetics, spatial control on a nanometer scale, and hierarchical assembly of two-dimensional (2D) or three-dimensional (3D) complex architectures.

M13 phage is a type of filamentous virus that has an inherent structural advantage for constructing rich nanostructures. See Y. Huang, C. Y. Chiang, S. K. Lee, Y. Gao, E. L. Hu, J. D. Yoreo, A. M. Belcher, *Nano Letters,* 2005, 5, 1429, which is incorporated by reference in its entirety. It has a single-strand DNA enclosed in a cylindrical capsid composed of approximately 2700 copies of the pVIII proteins, about 5 copies each of the pIII and pVI proteins at one end of the bacteriophage, and about 5 copies each of the pVII and pIX proteins at the other end. Id. The functionalities of these protein groups residing at different locations on a viral particle can be rationally altered independently via genetic engineering. Programmable protein functionalities can provide flexibility in assembling heterofunctional nanostructures, which makes this viral system an attractive template for synthesis and assembly of various materials and structures.

The ability to store information about a material, including composition, phase, and crystallographic detail, within the genetic code of the M13 bacteriophage virus DNA has proven to be a viable means of synthesizing and organizing materials on the nanometer scale. The use of phage display techniques can lead to the discovery of materials-specific peptides that have preferential binding, control over nanoparticle nucleation, and the ability to order on the basis of the inherent shape anisotropy of the filamentous M13 virus. It has previously been demonstrated that the M13 bacteriophage, which is ~880 nm in length and 6.6 nm in diameter, can be utilized as a template to generate nanowires through a nucleation, growth and annealing sequential process. See, for example, Mao, C., et al., Virus-Based Toolkit for the Directed Synthesis of Magnetic and Semiconducting Nanowires. Science, 2004. 303(5655): p. 213-217, which is incorporated by reference in its entirety. The 2700 copies of its pVIII coat protein allows for surface modifications of the virus particle, and introduction of functional groups with affinity for specific nanoparticles. For instance, the p8#9 variant expresses pVIII proteins with several serine amino acids, which through their hydroxyl groups, can coordinate, stabilize and organize gold or silver nanoparticles. See, Lee, Y., et al., Virus-templated Au and Au—Pt core-shell nanowires and their electrocatalytic activities for fuel cell applications. Energy & Environmental Science, 2012. 5(8): p. 8328-8334, which is incorporated by reference in its entirety. Another variant, the E3 bacteriophage, expresses three glutamic acids on each of its pVIII proteins, and thus has a negative surface charge at neutral pH and provides available carboxylic acid groups that can react in conjugation reactions for example.

Porous structures can be built by a layer-by-layer process (LbL). LbL films can be assembled on flat solid substrates (glass-slides, silicon, etc.). In conventional LbL assembly, a substrate to be coated with a thin film is repeatedly dipped in solutions of the complementary materials. Each dipping cycle deposits a coating of one material over the underlying layers. Other coating methodologies can be used. The composition of the deposited films can be controlled via manipulation of the process conditions such as spray times, concentration of the solutions, and ionic strength. The LbL film can include at least one layer including a polyelectrolyte; and at least one layer including a plurality of virus particles.

The number of bilayers can be in the range of 1 to 500, 5 to 250, 10 to 100, or 20 to 80. The total thickness of the multilayer film can be in the range of from 50 nm or less to 500 nm or greater. In some cases, the total thickness of the multilayer film can be in the range of 50 nm to 400 nm, 75 nm to 300 nm, or 100 nm to 200 nm.

Figure 12:
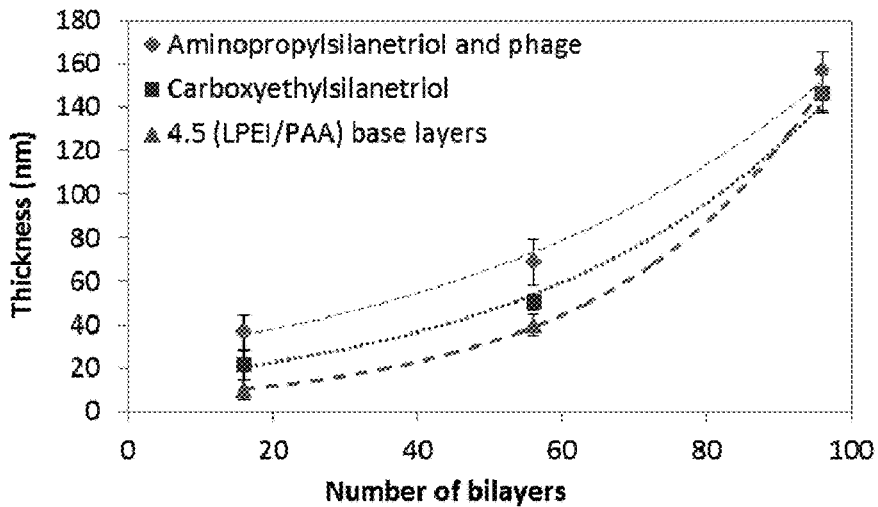
FIG. 12 is a graph depicting growth curves for E3 bacteriophage film constructed on silicon substrates functionalized with three different methods.

Layer-by-layer (LbL) assembly provides a mean to assemble nano-objects in a tightly controlled manner in terms of thickness, morphology, and composition at the nanoscale. In addition, it has several advantages, such as being a low-cost, aqueous solution based technique. See, Decher, G., Fuzzy nanoassemblies: Toward layered polymeric multicomposites. Science, 1997. 277(5330): p. 1232-1237, and Hammond, P. T., Form and function in multilayer assembly: New applications at the nanoscale. Advanced Materials, 2004. 16(15 SPEC. ISS.): p. 1271-1293, each of which is incorporated by reference in its entirety. LbL can be based on electrostatic interactions, hydrogen bonding, but also covalent crosslinks. The later allows for the assembly of a single type of nano-object, such as the M13 bacteriophage, onto a substrate. While crosslinking molecules in solution often results in gels with high porosity but larger pores, the molecules are more tightly packed in a covalent LbL process. Covalent LbL based on 1-ethyl-3-(3-dimethylaminopropyl)carbodiimide (EDC) chemistry has been employed by other groups to assemble films of proteins or polymers. See, Tengvall, P., et al., Preparation of multilayer plasma protein films on silicon by EDC/NES coupling chemistry. Colloids and Surfaces B: Biointerfaces, 2003. 28(4): p. 261-272, and Serizawa, T., et al., Thermoresponsive ultrathin hydrogels prepared by sequential chemical reactions. Macromolecules, 2002. 35(6): p. 2184-2189, each of which is incorporated by reference in its entirety. The bacteriophages are assembled in a LbL fashion using EDC as a crosslinking agent in a novel and versatile covalent LbL process. The process relies on the crosslinking of carboxylic acid and amine groups, which are ubiquitously present on the surface of any M13 bacteriophage variant. This thus makes the process very versatile for the incorporation of viruses with different functionalities. The films can also be grown on a variety of substrates, if they can either silanized or a negative charge can be generated on their surface upon plasma treatment. Bacteriophage film can be constructed on glass, silicon wafers, plastics, and metal foils, and different surface functionalization methods result in growing films during LbL assembly as shown in FIG. 12. The growth of these films was reported to be linear and to depend on the number of dipping repetitions, like in an electrostatic LbL assembly. A single protein with a negative surface charge at neutral pH, the human serum albumin, could be layered with a linear growth profile, indicating that repulsive electrostatic interactions do not disrupt the diffusion of the molecules from the solution to the surface and the covalent bond formation.

Genetically engineered M13 bacteriophages can generate a porous template for the deposition of inorganic materials, via a covalent layer-by-layer (LbL) assembly method that uses a carbodiimide crosslinker commonly employed in bioconjugation.

Stability of films can be enhanced by crosslinking. Crosslinking can be accomplished between layers of the LbL structure, or between an LbL structure and the surface of the substrate, or both. For example, a solid substrate can be functionalized before contacting with a crosslinking solution. Substrates can be functionalized by a variety of different methods, including via silanization or formation of self-assembled monolayers. For example, genetically engineered M13 bacteriophages are employed to generate a porous template for the deposition of inorganic materials, via a covalent layer-by-layer (LbL) assembly method. This method can employ a crosslinker to form covalent bonds between the layers, such as a carbodiimide crosslinker commonly employed in bioconjugation. This solution-based method enables the tight control of the thickness and composition of the different substrate-specific bacteriophage layers at the nanometer scale. See, for example, Hammond, P. T. *Adv. Mater.* 2004, 16, 1271-1293, which has been incorporated by reference in its entirety.

The high aspect ratio viruses (which can be 880 nm in length by 6 nm in diameter) that compose the films can exhibit up to 2700 identical substrate-specific peptides on their surface, and thus bind, nucleate and spatially orient materials to form nanowires. See, for example, Mao, C.; Solis, D. J.; Reiss, B. D.; Kottmann, S. T.; Sweeney, R. Y.; Hayhurts, A.; Georgiou, G.; Iverson, B.; Belcher, A. M. *Science* 2004, 303, 213-217, which is incorporated by reference in its entirety. M13 bacteriophages have been used, for instance, in the biomineralization of titanium dioxide ($TiO_2$), as well as in the specific nucleation of gold and of semiconducting GaAs. See, for example, Huang, Y.; Chiang, C.-Y.; Lee, S. K.; Gao, Y.; Hu, E. L.; De Yoreo, J.; Belcher, A. M. *Nano Letters* 2005, 5, 1429-1434 or Whaler, S. R.; English, D. S.; Hu, E. L.; Barbara, P. F.; Belcher, A. M. *Nature* 2000, 405, 665-668, each of which are incorporated by reference in its entirety. Organizing these phages into a three dimensional network creates a porous scaffold onto which metallic nanoparticles, crystals or metal oxides like titania can be assembled.

These networks provide a means of manipulating electron and other carrier transport within electrochemical or photoactive devices.

The virus films allow for the templating of inorganic nanowire networks, and also for the incorporation of other polymeric or metallic materials into the pores, and could be applied to energy related devices. For instance, $TiO_2$ coated bacteriophage films can be used for photovoltaic applications, such as bulk heterojunctions that require nanoporous semiconductor thin films, with a high porosity to also incorporate a light harvesting material in the structure.

Chemically modified, functionalized, solid surfaces are necessary in many laboratory procedures involved in chemistry and biotechnology. In modifying siliceous or metal oxide surfaces, one technique that has been used is derivatization with bifunctional silanes, i.e., silanes having a first functional group enabling covalent binding to the surface and a second functional group that can impart the desired chemical and/or physical modifications to the surface.

The process of substrate silanization involves contacting the surface of a solid substrate with a derivatizing composition that contains a mixture of silanes. The silanes can be coupled to the substrate surface via reactive hydrophilic moieties present on the substrate surface. The reactive hydrophilic moieties on the substrate surface are typically hydroxyl groups, carboxyl groups, thiol groups, and/or substituted or unsubstituted amino groups.

Another group of material to functionalize a substrate includes a polyelectrolyte, for example, a cationic polyelectrolyte. A first layer-by-layer film can comprise a cationic polyelectrolyte selected from the group consisting of polydiallyldimethyl-ammonium chloride (PDAC), poly(amidoamine) (PAMAM), poly(allylamine hydrochloride) (PAH), and linear-polyethylenimine (LPEI). A second layer-by-layer film can comprise an anionic polyelectrolyte selected from the group consisting of polystyrene sulfonate (SPS) and polyacrylic acid (PAA).

Crosslinking is used in both synthetic polymer chemistry and in the biological sciences. Crosslinks can be formed by chemical reactions that are initiated by heat, pressure, change in pH, or radiation. In the biological sciences, crosslinking typically refers to a more specific reaction used to probe molecular interactions. For example, a protein can be cross-linked together using small-molecule crosslinkers.

Four protein chemical targets account for the majority of crosslinking and chemical modification techniques: primary amine (—$NH_2$), carboxyl (—COOH), sulfhydryl (—SH), and carbonyls (—CHO). The group of primary amines exists at the N-terminus of each polypeptide chain and in the side chain of lysine residues. Because of its positive charge at physiologic conditions, primary amines are usually outward-facing of proteins; thus, they are usually accessible for conjugation without denaturing protein structure. A carboxyl exists at the C-terminus of each polypeptide chain and in the side chains of aspartic acid and glutamic acid. Like primary amines, carboxyls are usually on the surface of protein structure. The group of sulfhydryls exists in the side chain of cysteine. As part of a protein's secondary or tertiary structure, cysteines can be joined together between their side chains via disulfide bonds (—S—S—). These must be reduced to sulfhydryls to make them available for crosslinking by most types of reactive groups. The group of carbonyls, ketone or aldehyde, can be created in glycoproteins by oxidizing the polysaccharide post-translational modifications with sodium meta-periodate.

Crosslinkers for protein conjugation include carbodiimide, NHS ester, imidoester, maleimide, haloacetyl, pyridyldisulfide, hydrazide, or alkoxyamine. The selection of crosslinkers is based on their chemical reactivities and other chemical properties, such as chemical specificity, spacer arm length, water-solubility, reactive groups, and other characteristics. Examples of some common crosslinkers are an imidoester crosslinker, dimethyl suberimidate, the N-hydroxysuccinimide-ester crosslinker, bissulfosuccinimidyl suberate (BS3) or formaldehyde. Each of these crosslinkers induces nucleophilic attack of the amino group of lysine and subsequent covalent bonding via the crosslinker. EDC and other carbodiimides are zero-length crosslinkers; they cause direct conjugation of carboxylates (—COOH) to primary amines (—$NH_2$) without becoming part of the final crosslink (amide bond) between target molecules.

Genetically engineered M13 bacteriophages can be employed to generate a porous template for the deposition of inorganic materials, via a covalent layer-by-layer (LbL) assembly method that uses a carbodiimide crosslinker commonly employed in bioconjugation. This solution-based method enables the tight control of the thickness and composition of the different substrate-specific bacteriophage layers at the nanometer scale. Organizing these phages into a three dimensional network creates a porous scaffold onto which metallic nanoparticles, crystals or metal oxides like $TiO_2$ can be assembled. These networks provide a means of manipulating electron and other carrier transport within electrochemical or photoactive devices.

In addition to the non-specific $TiO_2$ synthesis, the porous bacteriophage scaffold can create possibilities for the three dimensional spatial arrangement of other inorganic materials with a high specificity. As the covalent LbL assembly process is applicable for any type of virus, distinct genetically engineered M13 bacteriophages with specific substrate binding properties can be assembled in different layers of a same film. Superposed porous inorganic layers of well-defined thicknesses and compositions can be constructed with this method. Such film architectures would be applicable to multijunction devices. These multi-layer films cannot easily be constructed by methods other than LbL assembly.

The virus films allow for the templating of inorganic nanowire networks, and also for the incorporation of other polymeric or metallic materials into the pores. The films can be applied to energy related devices. For instance, $TiO_2$ coated bacteriophage films can be used for photovoltaic applications, such as bulk heterojunctions that require nanoporous semiconductor thin films, with a high porosity to also incorporate a light harvesting material in the structure.

The combination of self-assembling biological scaffolds and metal oxides has great potential for the development of new solar cells. In addition, the pore sizes of the resulting nanowire network are in the order of 2 to 40 nm, and thus close to an exciton diffusion length in a conjugated polymer, which makes the bacteriophage template very promising for photovoltaic applications.

The performance of photovoltaic devices can be improved by using rationally designed nanocomposites with high electron mobility to efficiently collect photo-generated electrons. Using a genetically engineered M13 virus as a template, single-walled carbon nanotube—$TiO_2$ nanocrystal core—shell nanocomposites can improve the power conversion efficiency in the solar cells.

Previously, M13 bacteriophages have been adsorbed onto the surface of layer-by-layer assembled polymer films (see, Yoo, P. J., et al., Solvent-assisted patterning of polyelectrolyte multilayers and selective deposition of virus assemblies. Nano Letters, 2008. 8(4): p. 1081-1089, which is incorporated by reference in its entirety), and have also been used as polyanions in combinations with polymers to tune the morphology of layer-by-layer films (see, Chen, P.-Y., et al., Layer-by-layer assembled porous photoanodes for efficient electron collection in dye-sensitized solar cells. Journal of Materials Chemistry A, 2013. 1(6): p. 2217-2224, which is incorporated by reference in its entirety). The method described herein assembles LbL films composed solely of M13 bacteriophages. These bacteriophages can be functionalized with nanoparticles and quantum dots, and then serve as a vehicle for the controlled incorporation of elements in the thin film. The resulting bacteriophage scaffold can then be used to template a variety of semiconducting or metallic materials via sol-gel syntheses, generating nanoporous networks of wires. The properties of the bacteriophage nanotemplate, and the characterization of the template coated with crystalline titania are disclosed.

EXAMPLES

In one example, a covalent LbL assembly process is used with 1-ethyl-3-[3-dimethylaminopropyl]carbodiimide (EDC) as crosslinker. This crosslinker has been employed before to construct films of proteins by LbL for other purposes, and to crosslink protein and polymer films constructed by other methods. See, for example, Tengvall. P.; Jansson, E.; Askendal, A.; Thomsen, P.; Gretzer, C. *Colloids and Surfaces B: Biointerfaces* 2003, 28, 261-272, Cristiano, C. M. Z.; Fayad, S. J.; Porto, L. C.; Soldi, V. *J. Braz. Chem. Soc.* 2010, 2, 340-348, Cao, H.; Xu, S.-Y. *J. Mater. Sci: Mater. Med.* 2008, 19, 567-575, and Serizawa, T.; Nanameki, K.; Yamamoto, K., Akashi, M. *Macromolecules* 2002, 35, 2148-2189, each of which is incorporated by reference in its entirety. Cleaned and plasma treated silicon or glass substrates are first functionalized by any of the following 3 methods, in order to introduce carboxylic acid functional groups on the surface:

Method 1: Two step functionalization of the surface with bacteriophages: a) Silanization with aminopropylsilanetriol (2%(v/v)) using 90% (v/v) acetone in water as solvent, for 2 hours at room temperature. The silanized substrates were rinsed with acetone to remove excess silane, and cured at 80° C. for 1 h or in a dessicator overnight; b) Crosslinking of a first layer of bacteriophages with EDC and N-hydroxysulfosuccimide (sulfo-NHS), using 500 µl of solution per cm2 of substrate. EDC and sulfo-NHS were first added to a bacteriophage solution in water and agitated for 10 min to activate the carboxylic acid groups on the phage. The pH was then increased by diluting the solution to a phage concentration of $10^{11}$/mL with PBS at pH 7.4, and the solution is deposited immediately on the silanized substrate.

Method 2: Silanization with carboxyethylsilanetriol (0.5%(v/v)) using 90% (v/v) ethanol in water as solvent, for 2 hours at room temperature under agitation. The silanized substrates were rinsed with ethanol to remove excess silane, and cured at 80° C. for 1 h or in a dessicator overnight.

Method 3: Construction of polymeric base layers (less than 5 nm) using linear polyethyleneimine (LPEI) and poly-acrylic acid (PAA). Plasma treated substrates were dipped successively in LPEI and PAA solutions for 3 min, with 3 rinses in water between each step (30 seconds, 1 min, and 1.5 min rinses). The LPEI and PAA solution were at 20 mM and pH4.75 in water.

The film was then built by successively dipping the functionalized substrates in an EDC aqueous solution at pH 5 to activate the carboxylic acid groups, and then in a dilute bacteriophage solution in PBS (pH 6 to 8) to form amide bonds between bacteriophage layers. Two rinses in water were done after the dip in each solution. The dipping time in the EDC and phage solution have been varied from 5 to 30 min, and could likely be shorter. The EDC concentration was adjusted between 75 and 150 mM, and the phage concentration between $10^{12}$ and $10^{13}$ phage/mL. Films of different thickness were generated by selecting different numbers of dipping repetitions and by varying the concentration and pH of the solutions.

A covalent layer-by-layer assembly process was used with 1-ethyl-3-[3-dimethylaminopropyl]carbodiimide (EDC) as crosslinker. A first layer of bacteriophages was crosslinked with EDC and N-hydroxysulfosuccimide (sulfo-NHS), using 100 µl of solution per $cm^2$ of substrate. EDC and sulfo-NHS were first added to a bacteriophage solution in water and agitated for 10 min to activate the carboxylic acid groups on the phage. The pH was then increased by diluting the solution to a phage concentration of $10^{11}$/mL with PBS at pH 7.4, and the solution was deposited immediately on the silanized substrate.

The film was then built by successively dipping the functionalized substrates in an EDC aqueous solution at pH 5 to activate the carboxylic acid groups, and then in a dilute bacteriophage solution in PBS (pH 6 to 8) to form amide bonds between bacteriophage layers. Two rinses in water were done after the dip in each solution. The dipping time in the EDC and phage solution has been varied from 5 to 30 min, and can likely be shorter. The EDC concentration was adjusted between 75 and 150 mM, and the phage concentration between $10^{12}$ and $10^{13}$ phage/mL. Films of different thickness were generated by selecting different numbers of dipping repetitions and by varying the concentration and pH of the solutions.

$TiO_2$ was synthesized on the bacteriophage template via incubation in a 20 mM aqueous $TiCl4$ precursor solution at 50° C. or 80° C. until colloidal titania nanoparticles were obtained in solution. The duration of this process varies from 20 to 180 minutes, depending on the concentration of the $TiCl_4$ solution, the reaction volume and the temperature. The $TiO_2$ was annealed and the bacteriophages burnt off by heating at 450° C. for 1 h.

Taking advantage of the layer-by-layer assembly, distinct layers of materials can be created. In order to visualize the distribution of material through the film, viruses were decorated with gold nanoparticles of approximately 20 nm, attached to the p3 and p9 proteins (at each extremity of the virus) by incubating the viruses with the nanoparticles overnight at 4° C.

The thickness and roughness of the films were determined by profilometry. Atomic force microscopy (AFM) and scanning electron microscopy (SEM) were used to characterize their morphology. The film density and porosity were calculated based on quartz crystal microbalance (QCM) mass measurements.

FIG. 1 is the growth curve of the covalent LbL bacteriophage assembly for three different experimental conditions The films exhibit a linear growth characteristic of LbL process, as shown in FIG. 1, with a roughness equivalent to approximately 40% of the thickness.

Figure 2:
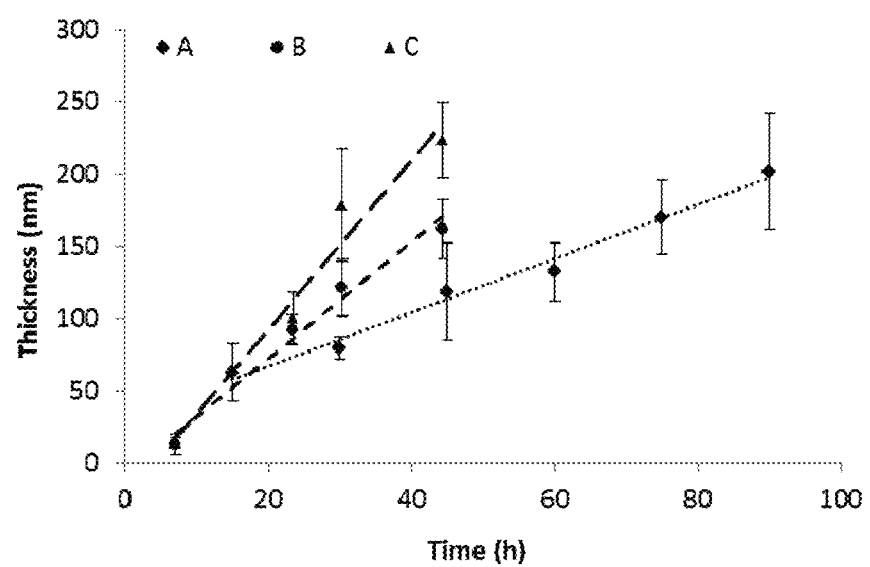
FIG. 2 is a graph depicting the thickness of the bacteriophage template as a function of time for three different experiment conditions.

FIG. 2 shows the thickness of the bacteriophage template as a function of time for three different experiment conditions. The growth rate is dependent on the EDC and phage concentrations, as well as the dipping time. Reducing the dipping time allows for the construction of films of equivalent thickness in a shorter time.

In FIG. 2, the number of bilayers was converted into time using the following conversions: for A, 1 bilayer=36 minutes, for B and C, 1 bilayer=14 minutes. In FIG. 1 and FIG. 2, A corresponds to the LbL process carried out with a 75 mM EDC solution in water, and bacteriophages at $5 \times 10^{12}$ phage/mL in PBS at pH8 on silicon functionalization with method 1 described above. The dipping times were set to 15 minutes in the EDC and phage baths, and two 1.5 minute rinses in water were performed after the dip in each solution. B and C correspond to dipping times reduced to 5 minutes in EDC and phage solutions with 1 minute rinses, and with phage solutions at $10^{13}$/mL. In B and C, the films were constructed in a silicon substrate functionalized with method 3 described above. In addition, C was carried out with a two-fold more concentrated EDC solution (150 mM).

Using QCM measurements, the density of the bacteriophage templates was found to be an average of $(3.86 \pm 0.08) \times 10^{-7}$ µg/µm$^3$ for three different film thicknesses, and the porosity as high as $(58.6 \pm 0.9)\%$, based on an estimated bacteriophage density of $9.33 \times 10^{-7}$ µg/µm$^3$.

Figure 3:
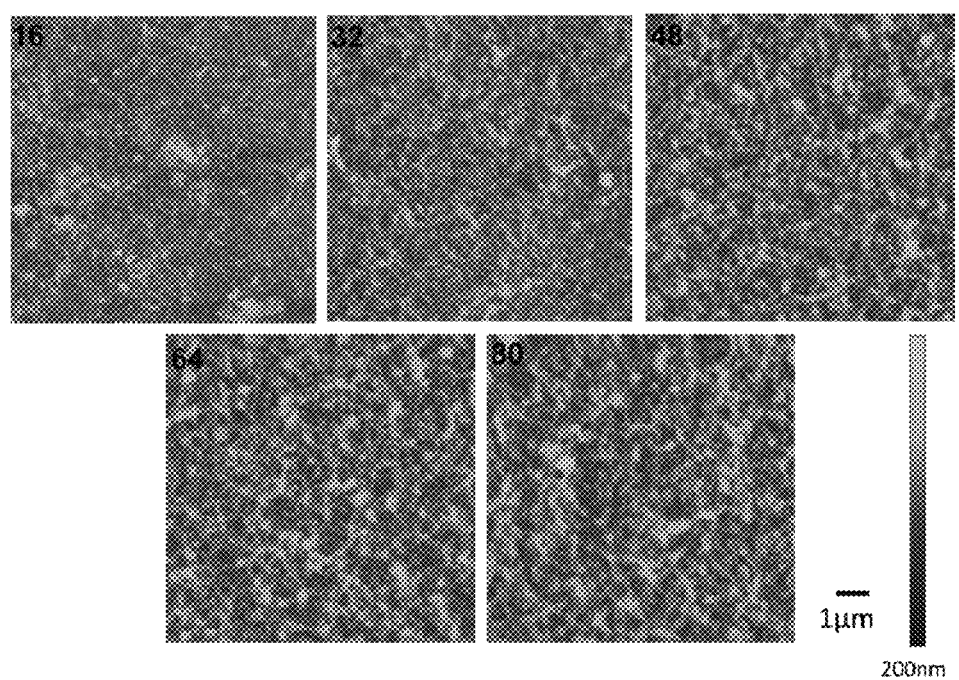
FIG. 3 is a series of AFM images of the bacteriophage film.

FIG. 3 shows the evolution of the film morphology: surface morphology of the bacteriophage film from 16 to 80 bilayers, imaged by AFM. As the thickness increases, the layers created by flatly deposited bacteriophages turn into a rougher and porous structure in which bacteriophages are part of a tridimensional architecture.

Figure 4:
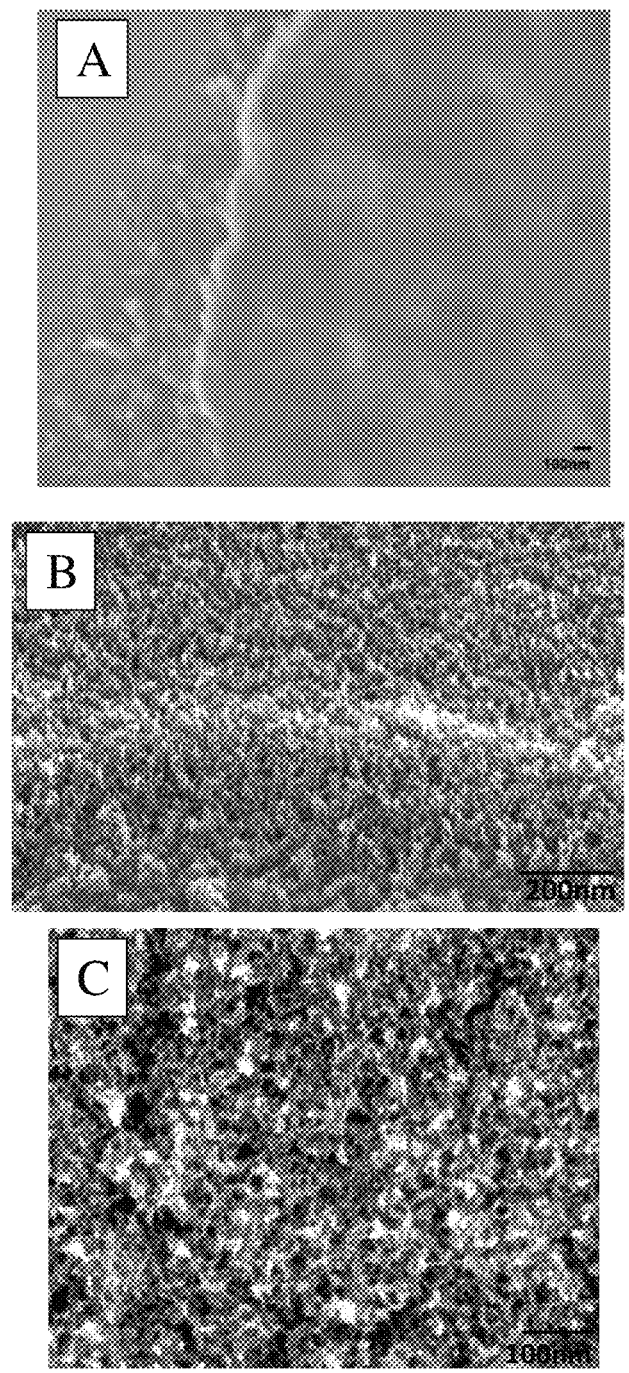
FIGS. 4A, 4B and 4C are micrographs of the bacteriophage film, and the film coated with titania after annealing.

FIG. 4 shows the bare bacteriophage scaffold and the scaffold coated with $TiO_2$. In A), a scratch in the film allows for the visualization of the highly porous structure. In B), the template covered with $TiO_2$ and annealed resulting in a network of semiconducting crystalline nanowires is shown, at a 52° angle to visualize both cross-section and top surface. In C) the top surface of a $TiO_2$ coated and annealed film at a higher magnification. The SEM image of A) is a 133 nm thick bacteriophage film with a thin conductive carbon coating, on silicon; the SEM images of B) and C) is the nanowire network formed by a 200 nm thick bacteriophage film templated with $TiO_2$.

Figure 5:
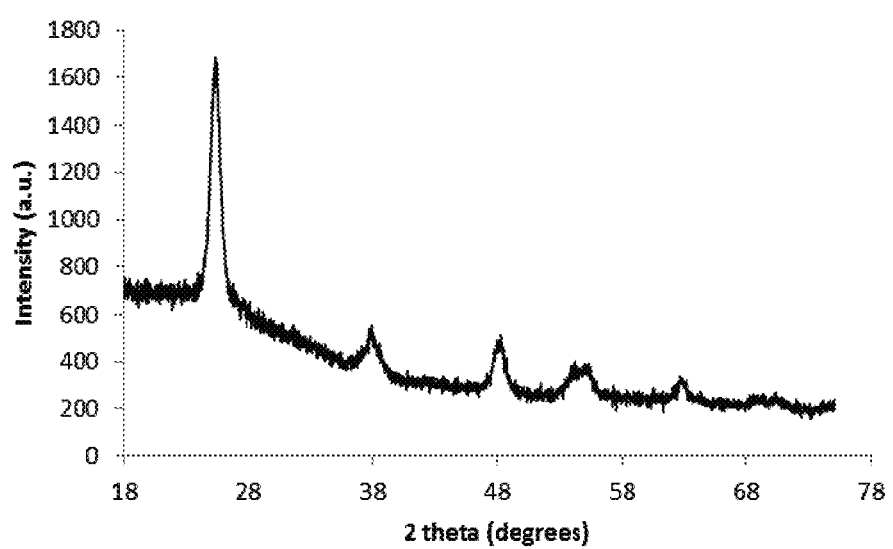
FIG. 5 is a XRD spectrum showing that anatase titania is obtained after the coating and annealing steps.

FIG. 5 shows a X-ray crystallography analysis of the titania formed by reacting $TiCl_4$ with the bacteriophages. By mimicking the chemistry that occurs during the $TiO_2$ deposition and the annealing process (In order to obtain enough material to perform XRD, E3 viruses were mixed with $TiCl_4$ in solution and the titania particles formed were dropcasted on glass and annealed at 450° C. for 1 h). The resulting spectrum corresponds to anatase titania.

In order to visualize the distribution of material through the film, viruses were decorated with gold nanoparticles of approximately 20 nm, attached to the p3 and p9 proteins (at each extremity of the virus) by incubating the viruses with the nanoparticles overnight at 4° C. Films with architectures displayed in FIG. 5A were constructed using the covalent LbL method and their composition was analyzed using XPS (surface and depth profiling). The results are shown in FIGS. 6B and 6C.

Figure 6A:
FIG. 6A is a series of drawings depicting the architectures of different films.
Figure 6B:
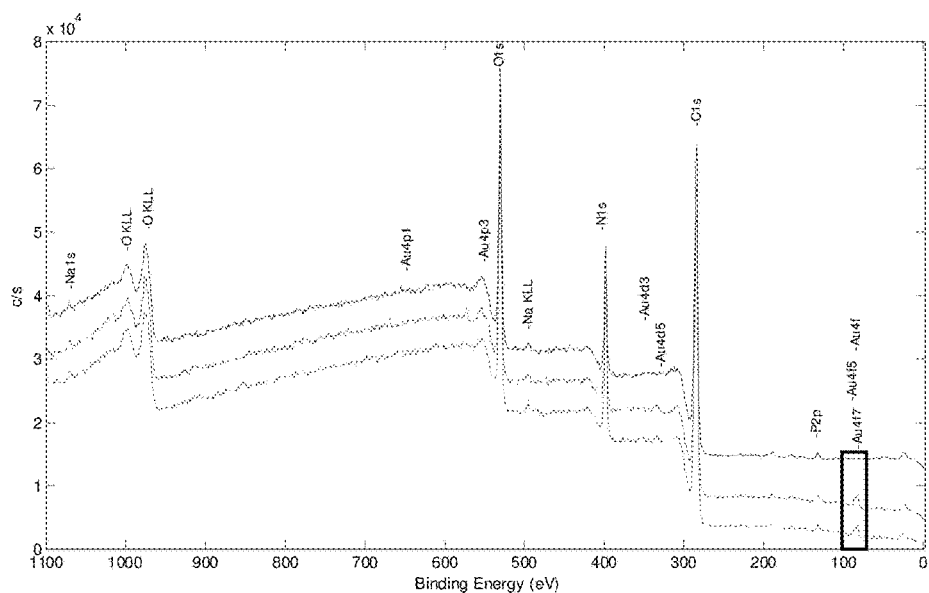
FIG. 6B is a graph depicting a surface survey scan of the films.
Figure 6C:
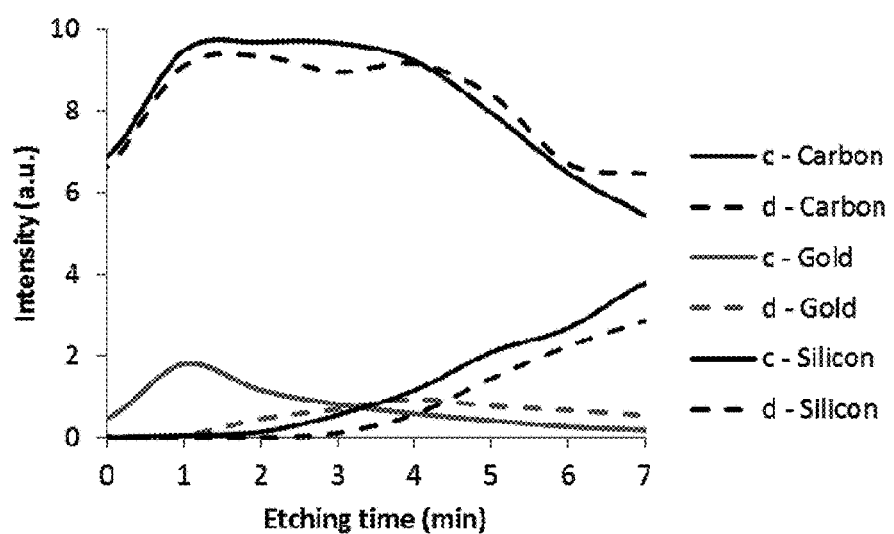
FIG. 6C is a graph depicting a depth profiling of the films.

FIG. 6 shows X-ray photoelectron spectroscopy analysis of films phage (the E3 variant) and phage decorated with gold nanoparticle, with different architectures. In FIG. 6A, silicon was used as substrate. FIG. 6B is surface survey scan of the films, where the green curve is representative of samples a and d, where the blue curve corresponds to sample b, and where the red curve corresponds to sample c. The gold peak (in black box) is seen for b and c. FIG. 6C is the depth profiling analysis of the films c and d, with an argon source at 1 kV, monitoring carbon, gold and silicon.

It can be seen that gold can only be detected on the surface of films b and c (FIG. 6B) and that the gold remains concentrated in either the top or the bottom layer (FIG. 6C) depending on the film architecture. It has to be noted that these are preliminary results and that the broadness of the peaks observed in FIG. 6C can be due to the high porosity of the film, as well as a relatively fast etching rate. Slower etching rates and different X-ray sources can be employed.

In addition to showing that distinct layers of bacteriophages, and thus of materials, can be created in the films, these results also show that gold nanoparticles can be incorporated into the phage films. These particles can potentially be used to create a plasmonic effect in a photovoltaic device and further increase the device performance.

After using the phage template to create a nanostructured titania film, a conjugated polymer such as poly(3-hexylthiophene) (P3HT) can be infiltrated in the pores to form a photovoltaic device. It has been previously shown that P3HT can be infiltrated uniformly from the top to the bottom of the film in nanoporous titania with pores having a diameter as small as 8 nm. See, Coakley, K. M. and McGehee, M.; Chem. Mater. 2004, 16, 4533-4542 and Coakley, K. M. et al.; Advanced Functional Materials 2003, 13, No. 4, 301-306, each of which are incorporated by reference in its entirety. It is thus expected that the pores of the phage templated titania films presented here can be uniformly and completely infiltrated with polymer chains. An alternative would also be to infiltrate the titania film with quantum dot crystal that could also be used as electron donor in solar cells and replace a conjugated polymer.

It is also expected that the titania films constructed here will have an electrochemical response, and could therefore be used as photocatalysts. Several anatase titania films have been reported to have photocatalytic activity, and the meso- or nanoporous ones to have a higher capacity than the microporous ones. See, Wu et al., Advanced Materials 2012, 10, 1-5, Chen, Y., Lunsford, S., Dionysiou, D. D., Thin Solid Films 2008, 516, 7930-7936, Arconada, N., Castro, Y., Duran, A., Applied Catalysis A: General 2012, 385, 101-107, Luo, S. et al., J. Sol-Gel Sci. Technol. 2009, 52, 1-7, Arconada, N. et al., Applied Catalysis B. Environmental 2009, 86, 1-7, and Kubiak et al., Journal of Power Sources 2008, 175, 510-516, each of which is incorporated by reference in its entirety. The nanoporous feature of the phage templated titania films, as well as their large surface area should improve the electrochemical response compared to a nanoparticle film built without template.

Figure 7:
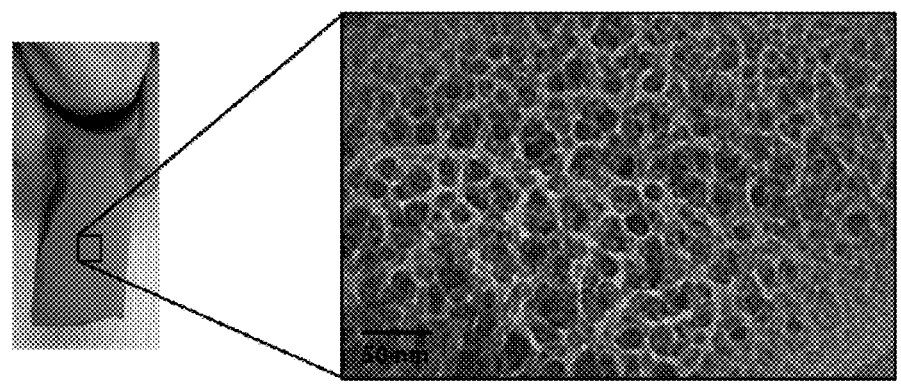
FIG. 7 is an optical image of a 300 bL bacteriophage film constructed on silicon and cross-sectional TEM image of the film, illustrating the nanoporous morphology of the film.

The bacteriophage films grow in a linear manner, characteristic to LbL assembly, as shown in FIGS. 1 and 2. Varying the EDC and bacteriophage concentrations, as well as the dipping time change the growth rate of the film, as a function of time, although the growth rate remains constant in terms of number of (EDC-phage) bilayers (bL). As the film grows, it evolves from a flat bacteriophage-functionalized surface to a porous and rough film, as illustrated in FIG. 3. In the AFM images shown in this figure, the high aspect ratio features observed in the 16 bL correspond to flatly deposited bacteriophages. These features become less visible as the thickness and roughness of the film increase. The surface roughness is generally proportional to 40% of the thickness of the film, and the porosity of a bacteriophage film was estimated to 58% by quartz crystal microbalance measurements (see FIG. 13 for details). Both the macroscopic appearance of the film conformally coating a silicon wafer, and the morphology of the film at the nanoscale can be observed in FIG. 7. The nanoporous cross-section of the bacteriophage film is depicted. The diameter of the wire-like features in this TEM image is approximately equivalent to the diameter of a bacteriophage.

Figure 15:
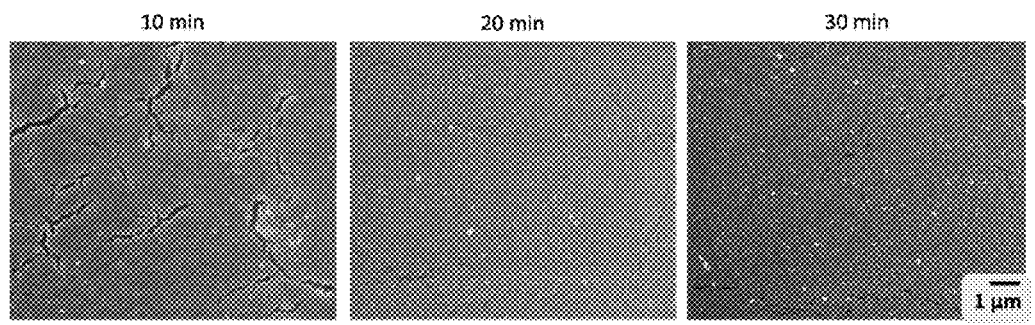
FIG. 15 is a series of SEM images of the top surface of titania coated bacteriophage films for different rates of temperature increase during the annealing step. The temperature was increased from 20 to 450° C. in 10, 20 or 30 minutes from left to right.
Figure 16:
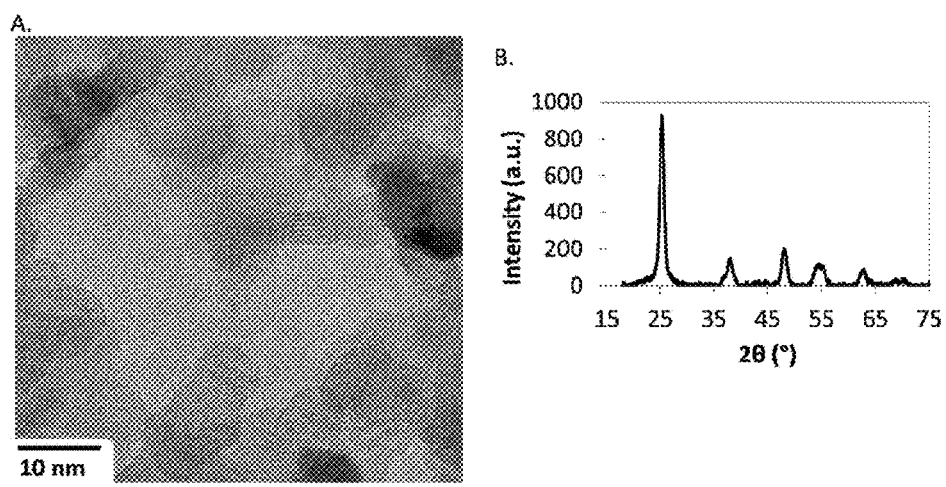
FIG. 16A is a TEM image depicting crystallinity of the phage film coated with titania, after annealing.
FIG. 16B is a graph depicting XRD confirming crystallinity of the phage film coated with titania, after annealing.
Figure 17:
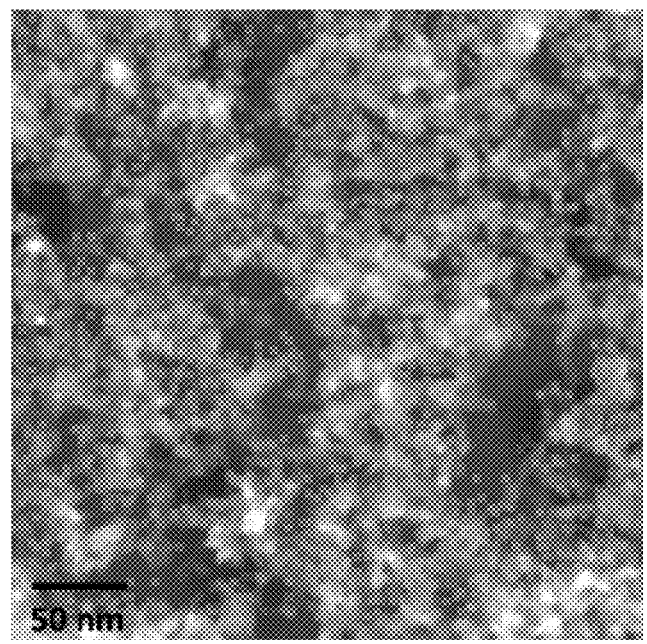
FIG. 17 is a micrograph depicting elemental mapping of titanium (in red) for a 10 bL phage film constructed on a silicon nitride support film, coated with titania and annealed.

Sol-gel syntheses are employed to nucleate nanoparticles onto the phage scaffold, and these nanoparticles are then sintered together to form a continuous mesh. Titania, a photoactive semiconductor that is easily synthesized in solution, is an example of materials that can be nucleated on the bacteriophage template. To nucleate titania onto bacteriophage films, the films are dipped vertically into an aqueous titanium tetrachloride ($TiCl_4$) solution, and hydrolysis is allowed to proceed at 80° C. for an hour. The films are then rinsed with dI water, dried, and annealed at 450° C. in air. This annealing step has a dual role; it generates anatase crystalline (See FIG. 15 for XRD and TEM characterization of the crystalline nanoparticles) and interconnected titania nanoparticles, and it also causes the combustion of the bacteriophage template, generating $CO_2$ gas, and removing organic materials from the film (see FIG. 12).

Figure 8:
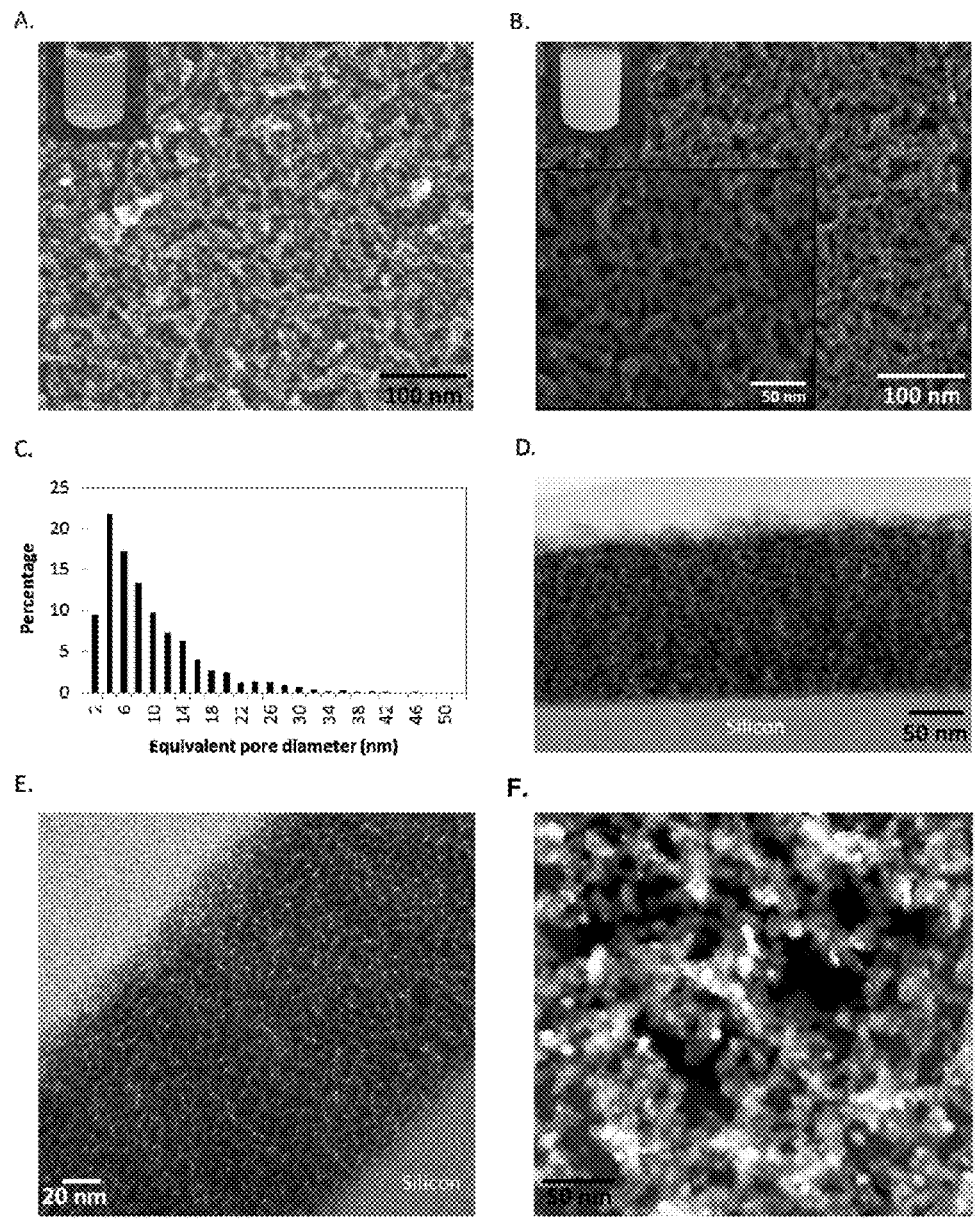
FIGS. 8A-8F represent titanium dioxide nanoporous structures.

The structure of a bacteriophage film coated with titania is depicted in FIG. 8. The surface morphology reveals a nanowire-like interconnected mesh, with a wire diameter of 10 nm or less, and a pore size distribution illustrated in FIG. 8C. Both on the surface and through the cross-section of the film, the vast majority of the pores have a diameter between 4 and 15 nm, which is in the order of an exciton diffusion length in conjugated polymers, and makes this titania nanoporous structure appealing for inorganic-organic heterojunction solar cell applications.

Figure 13:
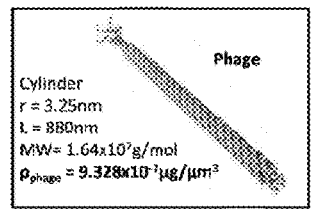
FIG. 13 represents quart crystal microbalance measurements and calculations. The porosity of the phage film was calculated from an approximation of a single bacteriophage density, and from the frequencies measured for a phage film constructed on a quartz crystal for different numbers of bilayers.
Figure 14A:
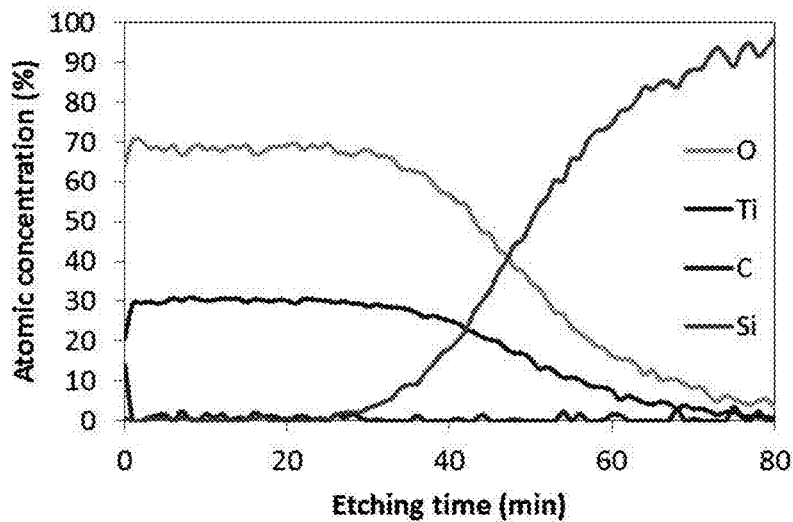
FIGS. 14A and 14B represent XPS depth profiling analysis of the $TiO_2$ coated phage film, after annealing at 450° C.
Figure 14B:
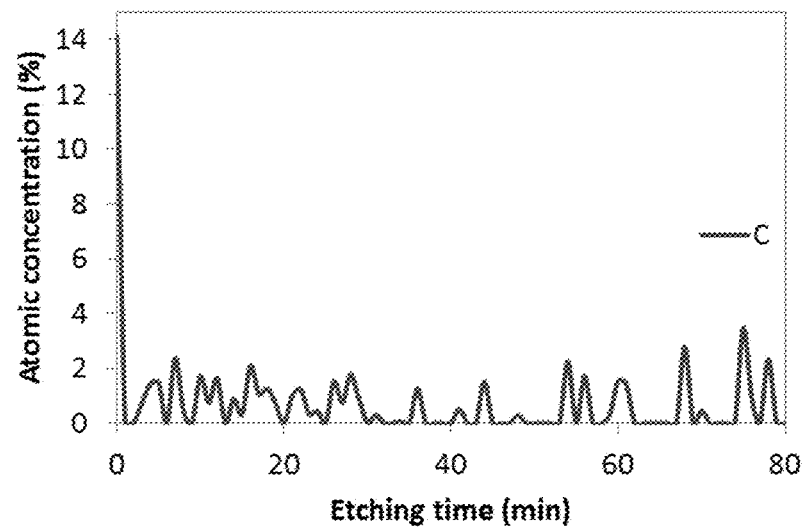

The reaction time for $TiO_2$ formation and the annealing step are critical for obtaining a nanoporous film that maintains the structure of the bacteriophage template. The dilute $TiCl_4$ solution is initially transparent, but its color changes as nanoparticles are formed. The solution turns light blue and then white as the nanometer-sized particles grow. If the reaction is stopped at an early stage, the shape of the wire is not as well-defined as when the reaction is stopped when more nanoparticles have time to nucleate onto the bacteriophage template (FIGS. 8A and 8B). However, if the reaction proceeds for too long, then the film grows thicker and the nanoporosity is lost, as nanoparticles aggregate with each other, forming larger structures. The rate at which the temperature is elevated to 450° C. also requires a fine balance for a successful preparation of the nanoporous titania. If the temperature is elevated slowly (in more than 30 m), then the bacteriophage scaffolds burns off before the titania nanoparticles are sintered together, resulting in a loss of structure, and the collapse of the film onto the substrate. A fast increase in temperature preserves the three-dimensional structure, but can also cause cracking of the film (if increased to 450° C. in 10 min or less) (FIG. 13).

FIGS. 8D and 8E show cross-sectional TEM images of a titania-coated bacteriophage film. With the dark field image show in FIG. 8D, the porosity of the film is illustrated by the differences in contrast in the section. The titania film is highly porous throughout its depth. In FIG. 8E, the morphology of the cross-section can be visualized, and wire-like continuous structures are observed uniformly throughout the section.

TEM also allows for a clearer visualization of the bacteriophage-mediated organization of the titania nanoparticles. FIG. 8F shows a STEM image of a thin film (10 (EDC-phage) bilayers) constructed, templated with titania, and annealed, on a silicon nitride support film. The pores can clearly be visualized, as well as the sintered nanoparticles arranged into wire-like structure. An elemental mapping of titanium is also available in FIG. 15.

Figure 9:
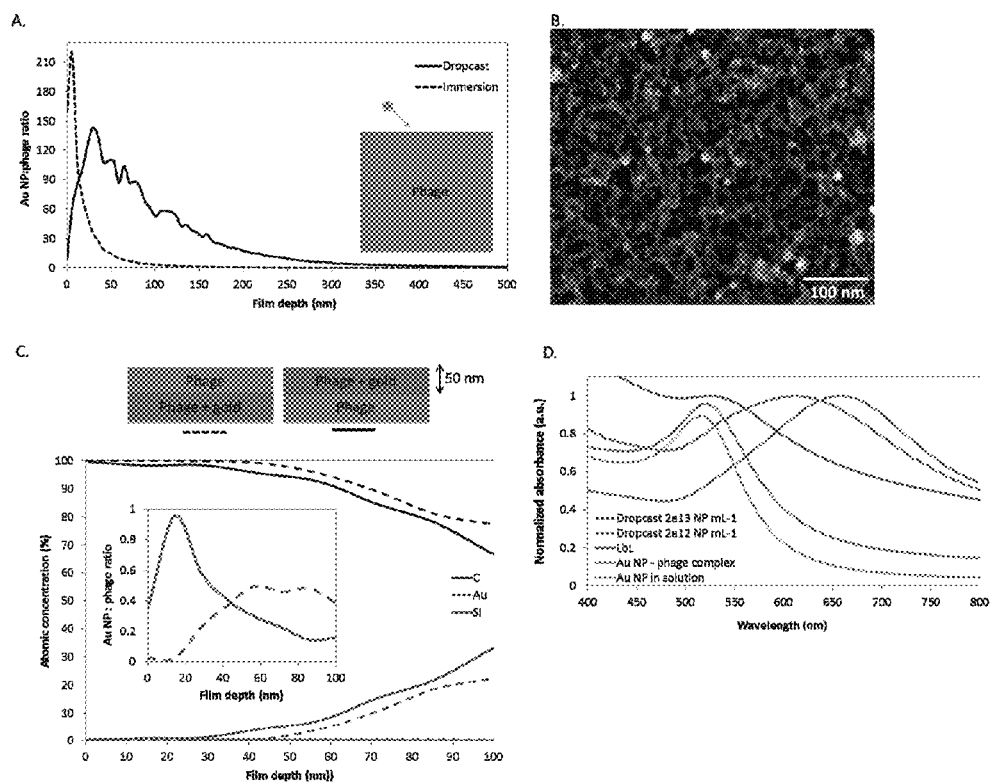
FIGS. 9A-9D represent tight spatial distribution control of the bacteriophage-mediated incorporation of gold nanoparticles.
Figure 10:
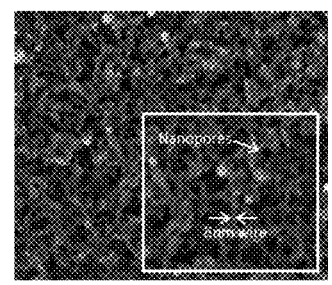
FIG. 10 is a micrograph depicting assembly of bacteriophage-based template for the organization of materials into nanoporous networks. The nanopores and nanowires can be visualized.
Figure 11:
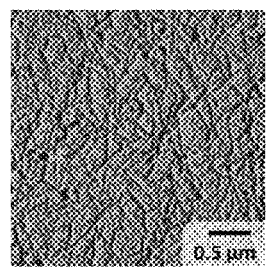
FIGS. 11A and 11B represent functionalizaton of the substrate and covalent layer-by-layer assembly of bacteriophages using EDC chemistry.
Figure 11:
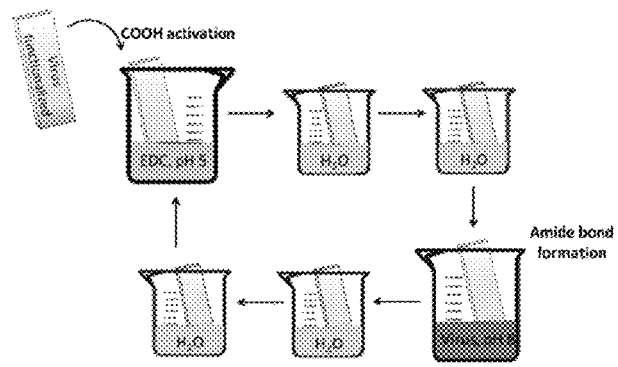
Figure 18:
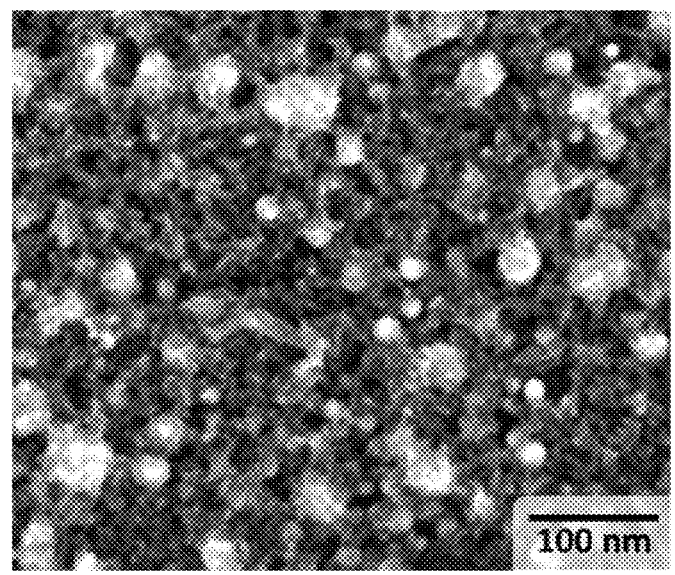
FIG. 18 is an SEM image of the top surface of an E3 bacteriophage film infiltrated with gold nanoparticles under the same conditions as the p8#9 film shown in FIG. 9B, coated with $TiO_2$ and annealed at 450° C.

Well distributed and spaced metallic nanoparticles into semiconducting networks have the potential to create plasmon resonances and enhance the performance of photovoltaic or other electronic devices. In the bacteriophage film, the distribution of nanoparticles varies significantly with the method of incorporation. Gold nanoparticles can be added to the structure post-assembly, either by immersing the film into a nanoparticle solution, or by dropcasting this solution onto the film and allowing it to dry. When immersed in a nanoparticle solution, the majority of the particles remains on the surface of the film, while capillary forces tend to attract the nanoparticles down into the film when they are dropcasted on the surface of the film (see XPS depth profiling results in FIG. 9A). The dropcast method results in a more uniform NP distribution, although the concentration of nanoparticles is still higher on the surface. FIG. 10 shows a titania-coated p8#9 phage film onto which Au nanoparticles were dropcasted before titania deposition. The functional groups on the p8#9 pVIII coat protein nucleated the particles and uniformly distributed them on the surface. This phenomenon is not observed for all M13 bacteriophage variants. For example, more aggregation is observed when nanoparticles are dropcasted onto E3 bacteriophage films (see FIG. 18).

Taking advantage of the LbL assembly method, nanoparticles can also be incorporated in a more controlled way. Typically, in the absence of blocking layers, polymer layers constructed via electrostatic LbL assembly inter-diffuse to form a quasi-homogeneous blend of polymers, to various degrees depending on pH and other external factors such as the surrounding solution. See, Gilbert, J. B., M. F. Rubner, and R. E. Cohen, Depth-profiling X-ray photoelectron spectroscopy (XPS) analysis of interlayer diffusion in polyelectrolyte multilayers. Proceedings of the National Academy of Sciences, 2013. 110(17): p. 6651-6656, which is incorporated by reference in its entirety. It is also the case of electrostatically adsorbed viruses onto polyelectrolyte layers. See, Yoo, P. J., et al., Controlling surface mobility in interdiffusing polyelectrolyte multilayers. ACS Nano, 2008. 2(3): p. 561-571, which is incorporated by reference in its entirety. This inter-diffusion, favorable for some applications, destroys the nanoscale structure of film. In the covalently-assembled bacteriophage films, the layers of viruses can be precisely assembled on top of each other and remain segregated. Because covalent bonds are linking them, the film does not disassemble or swell upon changes in pH or salt concentration. In addition, these covalent crosslinks provide a mean to tightly control the spatial organization of materials in the films.

Figure 19:
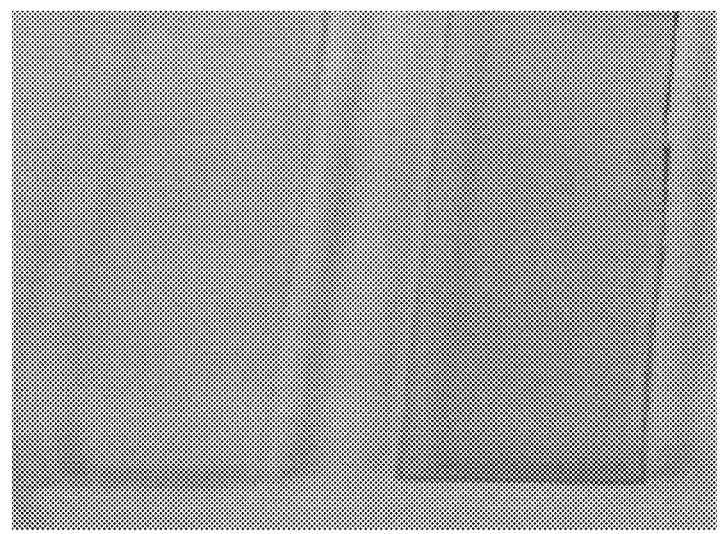
FIG. 19 is an optical image of bacteriophage films constructed on glass (Left, without nanoparticles; Right, with gold nanoparticles incorporated using bacteriophages as carriers).

As reported previously, M13 bacteriophages can be used as a vehicle to carry nanoparticles. FIG. 9C shows various film architectures that have been constructed with bacteriophages complexed with Au nanoparticles pre-assembly. Through XPS depth profiling analysis, the nanoparticles can be precisely localized in the film at a resolution of 50 nm when using 20 nm in diameter Au nanoparticles. When Au nanoparticles are incorporated during the film assembly, their presence can be visualized macroscopically, as they give a uniform red color to the film (see optical images of films constructed on glass slides in FIG. 19). When only bacteriophages are assembled, the resulting film is transparent. By extrapolation, two different types of nanoparticles can be spatially organized into two distinct layers. The nanoparticle can be less than 100 nm, less than 50 nm, less than 30 nm in size. The nanoparticle can include a metal or a metal oxide. For example, a metal can include a manganese, a magnesium, an aluminum, a silicon, a zinc, a copper, a nickel, a cobalt, an iron, a titanium, an yttrium, a zirconium, a niobium, a ruthenium, a rhodium, a palladium, a silver, an indium, a tin, an lanthanum, an iridium, a platinum, a gold, a cerium, a neodymium, a praseodymium, an erbium, a dysprosium, a terbium, a samarium, a lutetium, a gadolinium, a ytterbium, a europium, a holmium, a scandium, or a combination thereof. A metal oxide can include a manganese oxide, a magnesium oxide, an aluminum oxide, a silicon oxide, a zinc oxide, a copper oxide, a nickel oxide, a cobalt oxide, an iron oxide, a titanium oxide, an yttrium oxide, a zirconium oxide, a niobium oxide, a ruthenium oxide, a rhodium oxide, a palladium oxide, a silver oxide, an indium oxide, a tin oxide, an lanthanum oxide, an iridium oxide, a platinum oxide, a gold oxide, a cerium oxide, a neodymium oxide, a praseodymium oxide, an erbium oxide, a dysprosium oxide, a terbium oxide, a samarium oxide, a lutetium oxide, a gadolinium oxide, a ytterbium oxide, a europium oxide, a holmium oxide, a scandium oxide, or a combination thereof. Bacteriophage films that contain gold nanoparticles exhibit optical characteristic similar to nanoparticles in solution but with an absorption peak shifted to slightly longer wavelengths (FIG. 9D). This absorption peak is due to the phenomenon of localized surface plasmon resonance, which occurs when noble metal nanoparticles are embedded in a dielectric medium. Ten nanometer diameter gold nanoparticles suspended in water exhibit an absorption peak at 513 nm, however the resonant peak is slightly shifted to a 518 nm when the nanoparticles are complexed to bacteriophages in aqueous solutions. Thus, arranging the particles along the bacteriophage slightly changes their plasmon resonances. This shift in resonant frequency is attributed to two effects: (1) the resonant wavelength of a plasmonic nanoparticle is strongly dependent on the dielectric constant of the surrounding medium, and (2) as the spacing between nanoparticles becomes smaller, the resonant wavelength shifts towards redder wavelengths. When gold nanoparticles are complexed onto the virus, the effective index of the surrounding medium is slightly increased due to the presence of the proteins ($n_{water}$=1.333, $n_{protein}$~1.6) and the net effect is to raise the resonant wavelength to a slightly redder wavelength.

When gold nanoparticles are dropcast onto the film, they will tend to fill the pores and form larger aggregates. From an optical perspective, plasmonic nanoparticle aggregates are able to support multiple resonance modes, which can result produce an absorption spectrum with a broader peak centered around a much longer wavelength. The effect is the same as that observed when charge-stabilized metal nanoparticles aggregate in solutions with high salt concentrations or ethanol. However, when the nanoparticles are incorporated during assembly using the bacteriophage as a carrier, the absorption peak position is only slightly shifted from that of particles complexed to bacteriophages in solution. The slight additional shift is due to the increased percentage of the medium surrounding the nanoparticles that is occupied by proteins of the film, compared with virus-nanoparticle complexes suspended in aqueous solutions. This observation indicates that the virus evenly disperses the nanoparticles along the complex and prevents nanoparticle aggregation, which means that plasmonic nanoparticles can be synthesized in solution and their optical properties will be only slightly perturbed when incorporated into the bacteriophage film through an LbL synthesis approach.

In conclusion, a LbL assembled film composed only of bacteriophages generates a nanoporous structure that can serve as a scaffold for the nucleation of nanoparticles synthesized by a sol-gel method. The nucleation of titania nanoparticles is described in this disclosure, but the template could also serve as a scaffold for other nanomaterials. Because the bacteriophages are assembled in a LbL fashion and they serve as nanoparticle carriers, gold and silver nanoparticles specifically localized into the film. The method described here for the controlled incorporation of gold nanoparticles would also be applicable to other quantum dots that can be directly attached to M13 bacteriophages. Different bacteriophage variants can bind photoactive quantum dots and nanoparticles that could serve roles in tandem or plasmon-enhanced solar devices. In addition, the nanoporosity of titania films described here and the nanoscale composition control are difficult to generate by other methods, making the use of the bacteriophage nanotemplate promising for various devices.

A number of embodiments of the invention have been described. Nevertheless, it will be understood that various modifications may be made without departing from the spirit and scope of the invention. Accordingly, other embodiments are within the scope of the following claims.

What is claimed is:

1. A structure comprising:
   a metal or metal oxide film assembled on a multilayer porous virus scaffold, which is removed after the assembly of the film, wherein the film maintains a structure of the scaffold after the removal of the scaffold, and
   the film is an inorganic nanowire network having pores with a diameter between 2 and 40 nm with a majority of the pores having a diameter between 4 and 15 nm, and the film has a thickness between 50 and 500 nm.

2. The structure of claim 1, wherein the metal oxide includes a manganese oxide, a magnesium oxide, an aluminum oxide, a silicon oxide, a zinc oxide, a copper oxide, a nickel oxide, a cobalt oxide, an iron oxide, a titanium oxide, yttrium oxide, a zirconium oxide, a niobium oxide, a ruthenium oxide, a rhodium oxide, a palladium oxide, a silver oxide, an indium oxide, a tin oxide, an lanthanum oxide, an iridium oxide, a platinum oxide, a gold oxide, a cerium oxide, a neodymium oxide, a praseodymium oxide, an erbium oxide, a dysprosium oxide, a terbium oxide, a samarium oxide, a lutetium oxide, a gadolinium oxide, a ytterbium oxide, a europium oxide, a holmium oxide, a scandium oxide, or a combination thereof.

3. The structure of claim 2, further comprising a first nanoparticle and a second nanoparticle, wherein the first nanoparticle is a metal or metal oxide nanoparticle and the second nanoparticle is a metal or metal oxide nanoparticle.

4. The structure of claim 3, wherein the first nanoparticle and the second nanoparticle are in at least two different layers.

5. The structure of claim 1, wherein the multilayer porous virus scaffold includes an M13 bacteriophage.

6. The structure of claim 5, wherein a density of the M13 bacteriophage in the porous virus scaffold is in the range of $10^{-8}$ to $10^{-6}$ µg/µm$^3$.

7. The structure of claim 1, wherein a surface roughness of the multilayer porous virus scaffold is about 40% of the thickness.

8. The structure of claim 1, wherein the multilayer porous virus scaffold comprises from 5 to 250 layers.

9. The structure of claim 1, wherein the multilayer porous virus scaffold comprises from 10 to 100 layers.

10. The structure of claim 1, wherein the multilayer porous virus scaffold comprises from 20 to 80 layers.

11. The structure of claim 1, wherein the multilayer porous virus scaffold is removed by annealing.

12. The structure of claim 1, wherein the metal or metal oxide film is an anatase crystalline titania film.

13. The structure of claim 1, wherein the multilayer porous virus scaffold is a three dimensional scaffold.

* * * * *